United States Patent
Kepler

[11] Patent Number: 6,046,104
[45] Date of Patent: Apr. 4, 2000

[54] LOW PRESSURE BAKED HSQ GAP FILL LAYER FOLLOWING BARRIER LAYER DEPOSITION FOR HIGH INTEGRITY BORDERLESS VIAS

[75] Inventor: Nick Kepler, Saratoga, Calif.

[73] Assignee: Advanced Micro Devices, Inc., Sunnyvale, Calif.

[21] Appl. No.: 09/079,520

[22] Filed: May 15, 1998

[51] Int. Cl.$^7$ ............................................. H01L 21/4763
[52] U.S. Cl. .................... 438/637; 438/626; 438/627; 438/624; 438/631; 438/645; 438/648; 438/653; 438/658; 438/660; 438/666; 438/672
[58] Field of Search ..................... 438/598, 620, 438/624, 626, 627, 629, 631, 637, 638, 643, 645, 648, 653, 658, 660, 663, 666, 667, 672, 669

[56] References Cited

U.S. PATENT DOCUMENTS

| | | | |
|---|---|---|---|
| 5,866,945 | 2/1999 | Chen et al. | 257/750 |
| 5,888,898 | 3/1999 | Ngo et al. | 438/622 |
| 5,888,911 | 3/1999 | Ngo et al. | 438/788 |
| 5,925,932 | 7/1999 | Tran et al. | 257/750 |
| 5,942,801 | 8/1999 | Tran | 257/758 |

*Primary Examiner*—Jey Tsai
*Assistant Examiner*—Lynne A. Gurley

[57] ABSTRACT

Via void formation is substantially reduced or eliminated between the steps of depositing a barrier layer on a HSQ gap fill layer, and filling a through-hole with a conductive material deposited on the barrier layer, by performing a low-temperature baking following the deposition of the barrier layer. In particular, a high-temperature, low-pressure degas operation is performed immediately preceding, and in-situ with, the tungsten plug deposition that fills the through-hole to form a via. The low-pressure baking is performed at a high temperature and sufficiently low pressure that is less than the vapor pressure of imparities contained in the HSQ. Hence, any exposed portions of the HSQ gap fill layer that are not covered by the barrier layer (e.g., the titanium nitride (TiN) liner) will be outgassed during the low-pressure baking to minimize the possibility of HSQ outgas during tungsten deposition.

33 Claims, 4 Drawing Sheets

LOW PRESSURE BAKED HSQ GAP FILL LAYER FOLLOWING BARRIER LAYER DEPOSITION FOR HIGH INTEGRITY BORDERLESS VIAS

BACKGROUND OF THE INVENTION

1. Technical Field

The present invention relates to high density, multi-metal layer semiconductor devices with reliable interconnection patterns. The invention has particular applicability in manufacturing ultra large scale integration multi-metal layer semiconductor devices with design features of 0.25 microns and under.

2. Background Art

The escalating demands for high density and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical-mechanical polishing (CMP) planarization techniques.

FIGS. 1A, 1B, and 1C illustrate prior art techniques for filling a gap between metal lines. As shown in FIG. 1A, conventional practices comprise depositing metal layer 12 on dielectric layer 10 which is typically formed on a semiconductor substrate containing an active region with transistors (not shown). After photolithography, etching is then conducted to form a patterned metal layer comprising metal lines 12a, 12b with gaps therebetween.

Filling of the gap between metal lines 12a and 12b must be performed without formation of a void, i.e., a location where a deposited oxide layer covers the metal lines 12 but does not completely fill the gap between lines 12a and 12b. A deposited oxide layer that does not completely fill the gap between lines 12a and 12b is also referred to as a "breadloaf" structure. One technique for filling the gap between metal lines 12a and 12b uses spin on glass (SOG) as a gap fill. A thin TEOS adhesion promoting liner 14 is first deposited overlying the metal lines 12a and 12b and the exposed dielectric layer 10 in the gap. A dielectric material 16, such as spin on glass (SOG), is then deposited overlying the TEOS liner 14 to fill in the gaps between the metal lines 12a and 12b. The deposited SOG 16 is baked at a temperature of about 300° C. to about 350° C., and then cured at about 350° C. to about 400° C. for a period of time up to about one hour, depending upon the particular SOG material employed, to effect planarization. Another oxide layer 18 (e.g., TEOS) is then deposited by plasma enhanced chemical vapor deposition (PECVD) and then planarized by chemical-mechanical polishing (CMP).

FIG. 1B is a side view of the metal line 12a for illustrating formation of a through-hole (i.e., a via). As shown in FIG. 1B, a through-hole 20 is formed in the dielectric layer 18 to expose an underlying feature (e.g., the top surface of metal line 12a), wherein the metal feature 12a serves as a landing pad occupying the entire bottom of the through-hole 20. Outgassing is prevented so long as the top surface of the SOG layer 16 is below the top surface of metal feature 12a, and so long as the metal feature 12a completely encloses the bottom surface of the through-hole 20. A metal plug 30, for example tungsten, is then deposited to form a conductive via between the metal layer 12a and another overlying metal layer 36.

FIG. 1C illustrates an alternative approach for filling the gap between the metal lines 12a and 12b, wherein high density plasma (HDP) oxide is deposited and etched. Specifically, the HDP oxide layer 24 is formed by repeatedly performing deposit and etch steps, which removes any corners that may be formed in a breadloaf pattern in the deposited oxide. Hence, the gap between the metal lines 12a and 12b can be filled without a void and without the necessity of the SOG layer 16 of FIG. 1A. However, the repeated depositing and etching to form the HDP oxide layer 24 has a very slow throughput due to the overall slow rate of deposition. Once the gap between the metal lines 12 has been filled and void formation has been prevented, a layer of TEOS may then be deposited to complete formation of the interlayer dielectric between metal layers.

The reduction of design features to the range of 0.25 microns and under requires extremely high densification. The conventional practice of forming a landing pad completely enclosing the bottom surface of a conductive via utilizes a significant amount of precious real estate on a semiconductor chip which is antithetic to escalating high density requirements. In addition, it is extremely difficult to etch and fill through-holes having such reduced dimensions because of the extremely high aspect ratio, i.e., height of the thorough-hole with respect to diameter of the through-hole. Accordingly, conventional techniques include purposely widening the diameter of the through-hole to decrease the aspect ratio. As a result, normal and unpreventable amounts of misalignment cause the bottom surface of the conductive via to not be completely closed by the underlying metal feature. This type of via is called a "borderless via," and it conserves chip real estate.

The use of borderless vias, however, creates new problems. For example, if misalignment occurs during formation of a via in the arrangement of FIG. 1A, the SOG gap filling layer 16 is penetrated during etching when forming a misaligned through-hole. As a result of such penetration, moisture and gas accumulate during through-hole fill due to the low density and poor stability of SOG, thereby increasing the resistance of the interconnection.

Hydrogen silsesquioxane (HSQ) offers many advantages for use in interconnect patterns. HSQ is relatively carbon free, hence it is not necessary to etch back HSQ below the upper surface of the metal lines to avoid shorting. In addition, HSQ exhibits excellent planarity and is capable of gap filling interwiring spacings less than 0.15 microns employing conventional spin-on equipment. HSQ undergoes a melting phase at approximately 200° C., but does not convert to the high dielectric constant glass phase until reaching temperatures of about 400° C. for intermetal applications and about 700° C. to about 800° C. for premetal applications. HSQ also is similar to SOG, except that it has a low dielectric constant (low-K) such that it reduces interconnect capacitance and therefore increases circuit speed.

However, HSQ is susceptible to degradation during processing leading to various problems, such as voids (a/k/a "via poisoning") when forming borderless vias. For example, when forming a borderless via, a photoresist mask is deposited and a misaligned through-hole etched to expose a portion of an upper surface and a portion of a side surface of an underlying metal line, and to penetrate into and expose the HSQ layer. Etching to form the through-hole is typically conducted employing reactive ion etching with fluorocarbon chemistry, e.g., $CF_4$, with an attendant polymer formation. The photoresist mask is then stripped, typically employing an oxygen ($O_2$)-containing plasma. After the photoresist mask is plasma stripped, the through-hole is conventionally cleaned by employing a wet solvent, to remove polymers formed during reactive ion etching. Solvents conventionally employed include ACT935™ and ACT970™ available from Ashland Chemical Company in Pennsylvania. A further plasma stripping step is conventionally conducted after wet solvent cleaning.

During experimentation assessing the feasibility of employing HSQ for gap filling in interconnection patterns comprising a borderless via, it was found that the HSQ gap fill layer absorbs water during solvent cleaning of the misaligned through-hole. It was further found that upon subsequent filling of the through-hole, as with a barrier material such as titanium nitride or titanium-titanium nitride, followed by tungsten deposition to fill the via, outgassing occurs whereby voids are generated not only in the portion of the borderless via along a side surface of the lower feature, but throughout the borderless via. Such outgassing was also found to inhibit barrier metal adhesion resulting in undesirable interaction between tungsten hexafluoride, employed to deposit the tungsten, and the aluminum or aluminum alloy primary conductive layer of the lower metal feature.

One proposal to minimize the HSQ outgassing described in commonly-assigned, copending application Ser. No. 08/993,052, filed Dec. 18, 1997, "VACUUM BAKED HSQ GAP FILL LAYER FOR HIGH INTEGRITY BORDERLESS VIAS," (Attorney Docket 50100–428), includes preparing the exposed HSQ prior to filling the borderless via. Specifically, a high-temperature bake was performed, followed by a degas operation. Following the degas operation, the barrier layer (e.g., a TiN liner) was deposited which served as an adhesion promoter for the tungsten plug, and then the tungsten was deposited over the barrier layer to fill the via.

The proposal described in the above-identified application is effective, however, only if the TiN liner serving as a barrier layer completely covers, and thus prevents contact between the exposed HSQ layer surfaces and the tungsten. Outgassing may also occur following TiN liner deposition if poor adhesion is encountered between the deposited TiN liner and the exposed HSQ layer surfaces. Complete coverage of the HSQ layer with the TiN liner may be particularly difficult in a borderless via. For example, the metal layer at one edge of a borderless via is not always a precise angle. Specifically, the metal layer at the edge of a borderless via is coated with an anti-reflective coating, for example a thin layer of Ti (100Å) covered with a 1000Å layer of TiN. When the anti-reflective coating is etched back, a reentrant structure may be formed underneath the edge of the anti-reflective coating, also referred to as an "overhang." If a barrier deposition is attempted, the barrier layer not only needs to cover the sides of the borderless via, but also underneath the vertical overhang. Hence, the structure in a borderless via may prevent complete coating using a TiN barrier deposition before tungsten deposition. Hence, it may be particularly difficult to completely cover using physical vapor deposition.

Outgassing may also occur in bordered vias if HSQ is used to form the structure of FIG. 1B. Specifically, if HSQ is used as a gap fill that fills above the top surface of the metal lines 12, incomplete removal of the deposited HSQ layer from the top of the metal layer may result in residual HSQ between the metal and the dielectric (e.g., TEOS) layer 18). The residual HSQ may thus cause outgassing during formation of the tungsten plug filling the via.

In view of the manifest advantages of HSQ, there exists a need to provide technology whereby HSQ can be employed for voidless gap filling in forming interconnection patterns containing substantially voidless, high integrity borderless vias.

Hence, there is a need for overcoming the adverse effects of outgassing when HSQ is used during the formation or bordered and borderless vias.

SUMMARY OF THE INVENTION

There is a need for a method of manufacturing a high density multi-metal layer semiconductor device with design features of 0.25 microns and less, where the adverse effects of HSQ outgassing are minimized despite incomplete covering of HSQ regions before depositing conductive material to fill a via.

There is also a need for a method of manufacturing a semiconductor device that ensures reliable HSQ integration in borderless via formation, where HSQ outgassing can be minimized despite incomplete coverage of the exposed HSQ surfaces by a barrier liner prior to metal deposition.

These and other needs are attained by the present invention, wherein a low pressure baking step is performed between the steps of depositing a barrier layer on exposed portions of an HSQ gap fill layer, and filling a through-hole with a conductive material on the barrier layer to form a conductive via. One example of the present invention involves minimizing HSQ outgassing following depositing a barrier layer of titanium nitride (TiN) as a via liner. Normally the TiN liner deposition within a via protects the HSQ, for example in a borderless via. Assuming the via TiN liner does not completely coat all exposed HSQ surfaces within the through-hole (i.e., the via hole), a high-temperature, low-pressure degas step (i.e., a low pressure baking) is performed following the depositing of the barrier layer. Following the low-pressure baking step, the through-hole is filled in situ with the low-pressure baking step, for example using tungsten plug deposition. The low-pressure baking drives off material in the HSQ to prevent outgassing during the tungsten deposition step.

According to one aspect of the present invention, a method of manufacturing a semiconductor device comprises forming a first patterned conductive layer, having gaps therein and comprising a first conductive feature, on a first dielectric layer overlying on a substrate. A layer of hydrogen silsesquioxane (HSQ) is deposited that fills the gaps. A second dielectric layer is deposited on the first patterned conductive layer and on the HSQ gap fill layer, and an upper surface of the second dielectric layer is planarized. A through-hole is formed in the second dielectric layer that exposes a portion of the upper surface and at least a portion of a side surface of the first conductive feature that penetrates into and exposes a portion of the HSQ gap fill layer. A barrier layer is deposited on at least a portion of the exposed portions of the HSQ gap fill layer, and low pressure baking is performed following the depositing of the barrier layer. The through-hole is then filled with a conductive material on the barrier layer to form a borderless via. The low pressure baking ensures outgassing of any impurities in exposed portions of the HSQ gap fill layer that are not covered by the barrier layer prior to filling the through-hole. Hence, the borderless via may be formed reliably, resulting in a low and well-controlled borderless via resistance.

Another aspect of the present invention provides a method of manufacturing a semiconductor device, the method comprising forming a first patterned conductive layer, having gaps therein and comprising a first conductive feature, on a first dielectric layer overlying on a substrate. The method also includes depositing a layer of hydrogen silsesquioxane (HSQ) filling the gaps, depositing a second dielectric layer on the first patterned conductive layer and on the HSQ gap fill layer, and planarizing an upper surface of the second dielectric layer. A through-hole is formed in the second dielectric layer exposing at least a portion of the upper surface of the first conductive feature, and exposing at least a portion of the HSQ gap fill layer. The method also includes vacuum baking, depositing a barrier layer on at least the exposed portions of the HSQ gap fill layer following the vacuum baking, low pressure baking following the depositing of the barrier layer, and filling the through-hole with a conductive material on the barrier layer. The vacuum baking in combination with the low-pressure baking ensure that the occurrence of HSQ outgassing during the filling of the through-hole with conductive material is minimized for either bordered or borderless vias. Hence, HSQ outgassing is minimized, resulting in well-controlled and low-resistance vias, even if the deposited barrier layer does not completely cover the HSQ gap fill layer.

Additional objects, advantages and novel features of the invention will be set forth in part in the description which follows, and in part may become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The disclosed embodiment enables formation of substantially voidless, highly reliable bordered and borderless vias using HSQ to fill gaps in patterned metal layers without adverse consequences resulting from outgassing of the HSQ gap fill layer when filling a through-hole with conductive material.

HSQ is a highly desirable dielectric material for gap filling, in that it exhibits excellent planarity and gap filling capacity employing conventional spin-on equipment. HSQ can easily fill gaps, e.g., interwiring spacings, less than about 0.15 microns. One form of HSQ is commercially available from Dow Corning Corp. under the product name Flowable Oxide™ or FOX™.

According to the disclosed embodiment, void formation is substantially reduced or eliminated between the steps of depositing a barrier layer on the HSQ gap fill layer, and filling the through-hole with a conductive material on the barrier layer, by performing a low-temperature baking following the depositing of the barrier layer. In particular, the disclosed embodiment adds a high-temperature, low-pressure degas operation that occurs before, and in-situ with, the tungsten plug deposition that fills the through-hole to form a via. The low-pressure baking is performed at a high temperature and sufficiently low pressure that is less than the vapor pressure corresponding to the HSQ. Hence, any impurities or contaminants in the exposed portions of the HSQ gap fill layer that are not covered by the barrier layer (e.g., the titanium nitride (TiN) liner), and that normally would cause outgassing during the tungsten plug deposition, will be removed during the low-pressure baking to minimize the possibility of HSQ outgas during tungsten deposition.

Figure 1A:
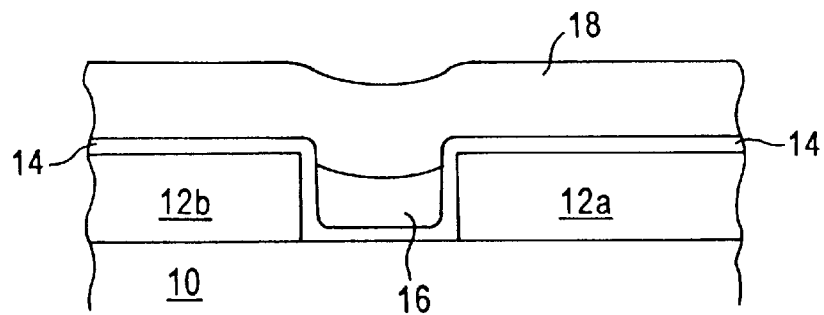
FIGS. 1A, 1B, and 1C are diagrams illustrating conventional gap filling of a patterned metal layer.
Figure 1B:
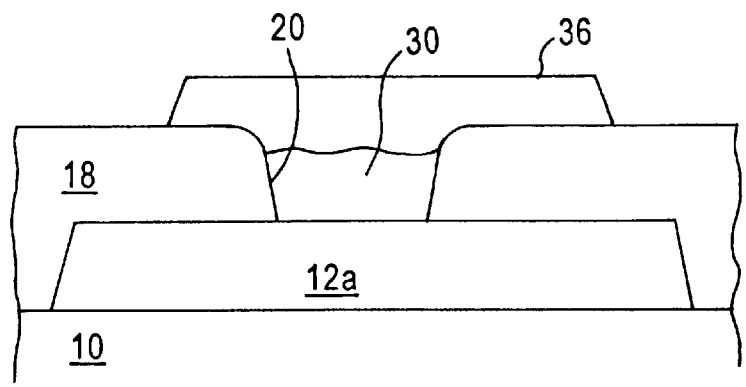
Figure 1C:
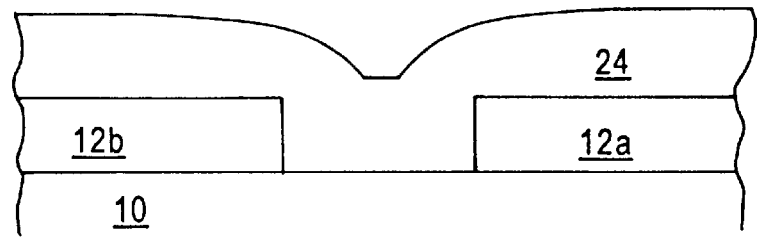
Figure 2:
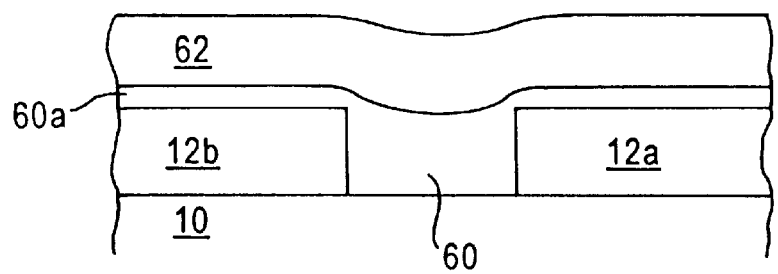
FIG. 2, is a diagram illustrating gap filling using HSQ.
Figure 5:
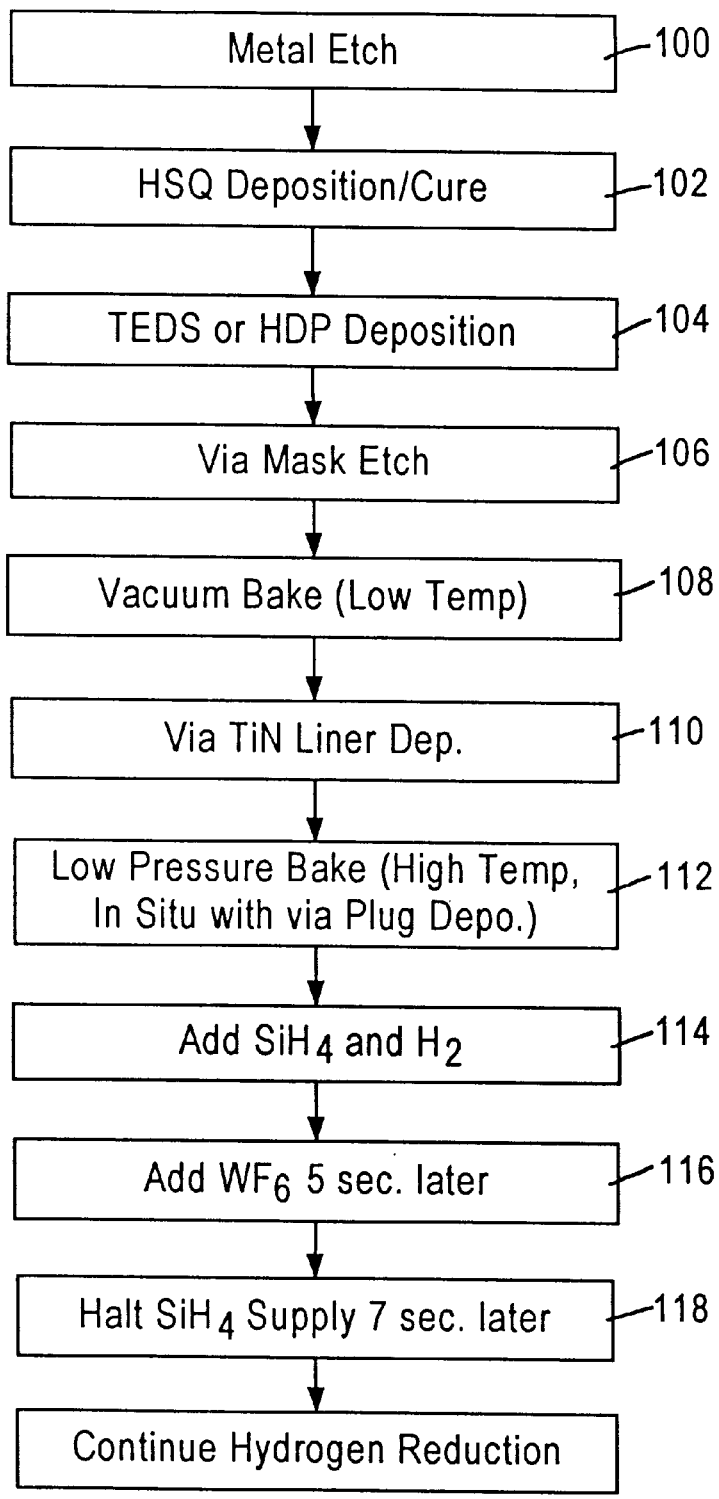
FIG. 5 is a flow diagram illustrating the method for manufacturing the semiconductor device according to an embodiment of the present invention.

FIG. 5 is a flow diagram illustrating a method for manufacturing a semiconductor device according to an embodiment of the present invention. FIG. 2 is a diagram illustrating formation of the HSQ gap fill layer between two metal lines 12 according to the method of FIG. 5. As shown in FIGS. 2 and 5, the patterned conductive layer having the metal lines 12a and 12b are formed in step 100 on the dielectric layer 10 that overlies on a substrate. A layer of HSQ 60 is then deposited in step 102, for example by spinning using conventional spinning equipment employed for SOG, at an appropriate temperature, e.g., about 200° C. HSQ is easily capable of completely voidlessly filling gaps even under 0.15 microns. If desired, an optional thin layer of TEOS liner may be deposited underneath the HSQ layer 60 to provide improved adhesion between the HSQ layer 60 and the metal layers 12 and/or the dielectric layer 10. The top portion 60a of the HSQ layer 60 may optionally be etched back to remove the HSQ gap fill layer from the top surfaces of the metal layers 12.

Following the depositing of the HSQ filling the gaps between the metal lines 12a and 12b, a second dielectric layer 62, for example TEOS or HDP, is deposited in step 104 on the patterned layer metal 12 and on the HSQ gap fill layer 60, resulting in the structure of FIG. 2.

Figure 3A:
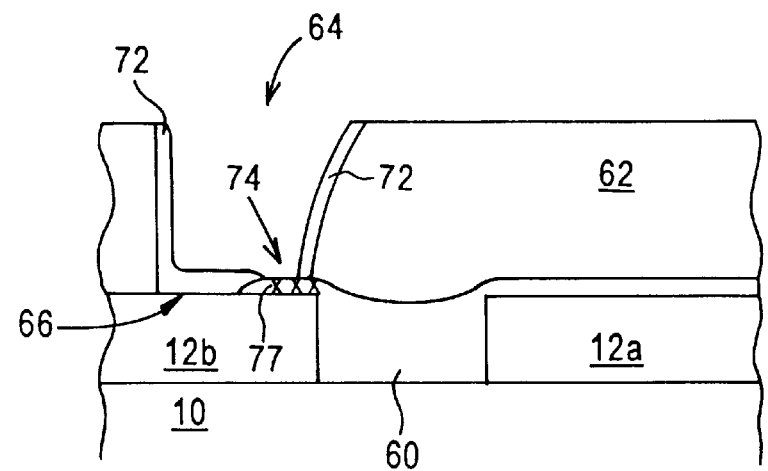
FIGS. 3A and 3B are diagrams illustrating incomplete coverage of an HSQ gap fill layer in a bordered via and the corresponding filled via, respectively, according to an embodiment of the present invention.
Figure 4A:
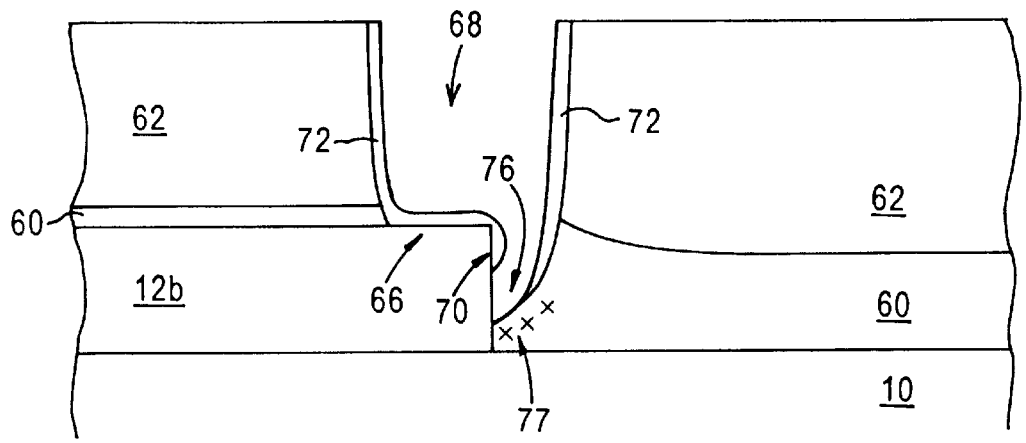
FIGS. 4A and 4B are diagrams illustrating incomplete coverage of an HSQ gap fill layer by a barrier layer and the completed borderless via, respectively, according to an embodiment of the present invention.

A through-hole is then formed in the second dielectric layer by patterning a via mask in step 106, followed by etching at least the second dielectric layer 62. The through-hole exposes a portion of the upper surface of one of the metal lines 12a or 12b, as shown in FIGS. 3A and 4A. Specifically, FIG. 3A is a diagram illustrating a through-hole for a bordered via, and FIG. 4A is a diagram illustrating a through-hole corresponding to a borderless via. As shown in FIG. 3A, the through-hole 64 exposes a portion of the upper surface 66 of the first conductive feature (i.e., the top surface of the metal line 12b). In contrast, FIG. 4A shows that the through-hole 68 exposes a portion of the upper surface 66 and at least a portion of a side surface 70 of the first conductive feature of the metal line 12b.

One difficulty in HSQ integration is the occurrence of outgassing during borderless via formation. As shown in FIG. 4A, the through-hole 68 exposing the upper surface 66 and at least a portion of the side surface 70 of the metal line 12b penetrates into and exposes a portion of the HSQ gap fill layer 60. Hence, there is a greater likelihood of HSQ outgassing of impurities 77 within the HSQ layer 60 during high temperature tungsten deposition due to the increased surface area in the HSQ layer 60 exposed during the mask/etch process of step 106. These impurities 77 may be absorbed by the HSQ layer 60 during formation of the borderless vias, and may include fluorocarbons, polymers, water, etc.

One step to reduce the outgassing is to perform a vacuum bake in step 108 that causes HSQ outgassing before deposition of a barrier layer, for example a titanium nitride (TiN) layer 72. The vacuum baking of step 108 is performed in a relatively short period of time, e.g., about 45 seconds to about 2 minutes, preferably at a low pressure no greater than about $10^{-6}$Torr, at a temperature of about 250° C. to about 400° C. Embodiments of the present invention include vacuum baking in the same tool employed for barrier metal deposition when filling the through-hole with conductive material.

Another problem generated by miniaturization relates to the RC time constant. HSQ desirably has an as-deposited dielectric constant of about 2.9–3.0, vis-a-vis silicon dioxide grown by thermal oxidation or chemical vapor deposition which has a dielectric constant of about 3.9–4.2. It was found that abrupt temperature changes adversely increase the dielectric constant of as-deposited HSQ. Accordingly, in an embodiment of the present invention, heat treatment to effect outgassing of absorbed water from the deposited HSQ gap fill layer is conducted in a gradual manner. In an aspect of this embodiment, the substrate, including the intermediate semiconductor device thus far fabricated, is placed into a furnace or tool preheated or maintained at a temperature of about 300° C. After the substrate has been placed within the furnace, the temperature of the furnace is elevated to the desired heat treating temperature, e.g., about 350° C. Subsequent to heat treating to outgas the deposited HSQ gap fill layer, the temperature is lowered to about 300° C. After the temperature within the furnace has been lowered to about 300° C., the substrate is removed. This procedure advantageously avoids subjecting the as-deposited HSQ gap fill layer to abrupt thermal changes, thereby minimizing any increase in its dielectric constant.

The above-described degassing operation by vacuum baking in step 108 is normally sufficient to minimize HSQ outgassing during via plug (e.g., tungsten) deposition. However, HSQ outgassing may still occur if the titanium nitride liner deposited in step 110 does not completely coat all the exposed HSQ surfaces within the via holes 64 or 68. For example, FIG. 3A illustrates an exposed HSQ region 74 that is not covered by the barrier layer 72. FIG. 4A illustrates another example of incomplete coating of the eight exposed HSQ surfaces in a borderless via, where the exposed HSQ surface 76 is not covered by the deposited titanium nitride barrier liner 72. As shown in FIGS. 3A and 4A, the exposed FHSQ surfaces 74 and 76 may cause HSQ outgassing of the impurities 77 during tungsten deposition due to the incomplete coverage of the barrier liner 72 over all the HSQ surfaces.

According to the disclosed embodiment, a high-temperature, low-pressure degas step 112 is performed before, and in-situ with, the via tungsten plug deposition starting in step 114. The outgas step 112 is performed at a sufficiently high temperature and a sufficiently low pressure less than the vapor pressure of the HSQ impurities 77, causing the impurities in the exposed HSQ to be driven off to prevent outgassing during tungsten deposition.

According to the disclosed embodiment, the outgas step 112 (i.e., low-pressure baking) is performed at a pressure of about 20 Torr to about 40 Torr, and at a temperature of about 445° C. to 485° C. Since the subsequent tungsten plug deposition steps are preferably performed at 445° C. at 40 Torr in step 114, the preferred embodiment performs the low-pressure baking in step 112 at a pressure of 20 Torr and a temperature of 445° C. The low-pressure baking is performed for about 10–20 seconds, causing the impurities 77 in the exposed HSQ at regions 74 and 76 to be driven off in a manner that minimizes HSQ outgassing during tungsten deposition.

Following the outgas step 112, the tungsten deposition is initiated in step 114 by adding $SiH_4$ vapor and hydrogen gas ($H_2$) at a temperature of 445° C. and at a pressure of 40 Torr in the same reaction chamber (i.e., in-situ) as the outgas step 112. At approximately 5 seconds after adding the $SiH_4$ and $H_2$ in step 114, tungsten hexafluoride ($WF_6$) is added in step 116, which causes the concurrent initiation of a silane reduction-based tungsten chemical vapor deposition (CVD) and a hydrogen reduction-based tungsten chemical vapor deposition The silane reduction-based tungsten CVD is expressed by the following equation:

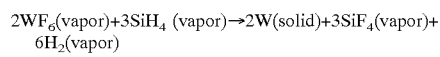

The hydrogen reduction-based tungsten CVD is expressed by the following equation:

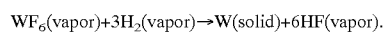

Hence, the addition of tungsten hexafluoride in step 116 concurrently initiates both the silane reduction-based and the hydrogen reduction-based tungsten CVD.

Figure 3B:
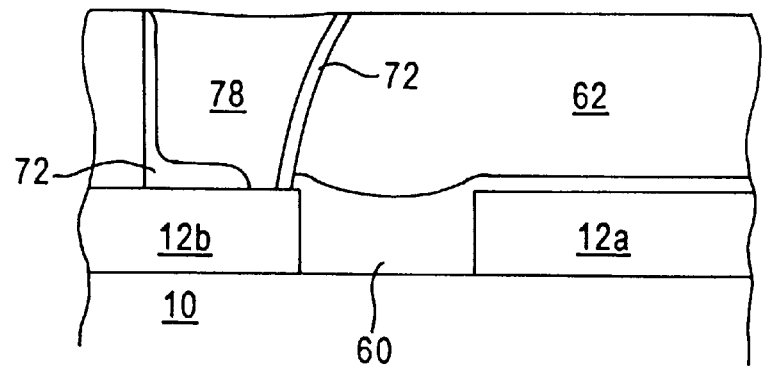
Figure 4B:
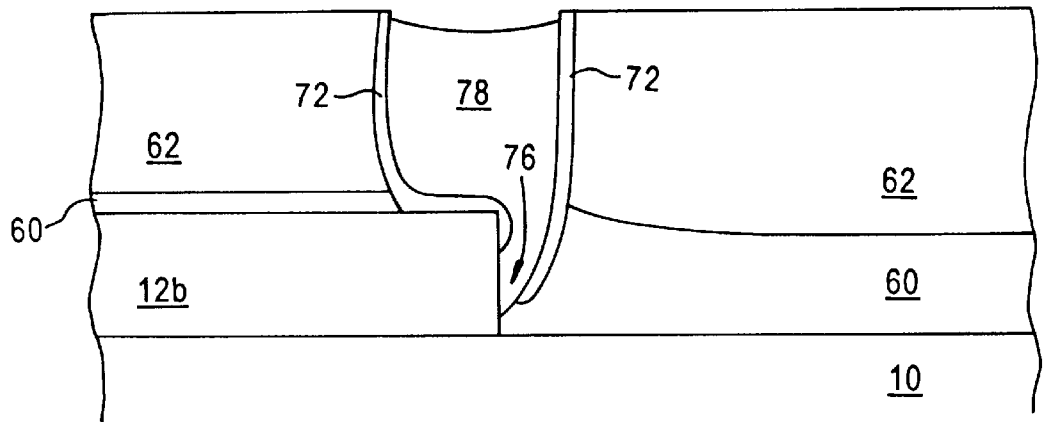

Following step 116, the silane reduction-based CVD is halted in step 118 approximately 7 seconds after initiation of step 116 by halting the supply of the $SiH_4$, while enabling the hydrogen reduction-based tungsten CVD to continue. Hence, the $SiH_4$ is supplied for a total of 12 seconds. The hydrogen reduction is continued in step 120 at about 445° C. and at a pressure of about 40 Torr until sufficient formation of the tungsten plug 78, as shown in FIGS. 3B and 4B.

The metal layers employed in the present invention are consistent with the conventional practices and typically comprise aluminum or an aluminum alloy. Embodiments of the present invention include forming a composite patterned metal layer comprising an initial refractory metal containing layer, such as tungsten, titanium or titanium nitride, an intermediate aluminum or aluminum alloy layer and an upper anti-reflective coating, such as titanium-titanium nitride. In accordance with the present invention, tungsten is deposited by conventional CVD technology.

The present invention is applicable to the production of various types of semiconductive devices, particularly high density multi-metal patterned layers with submicron features, particularly submicron features of 0.25 microns and below, exhibiting high speed characteristics and improved reliability. The present invention enables the advantageous use of HSQ to gap fill patterned metal layers without encountering a void formation problem upon filling a misaligned through-hole with a conductive material. The present invention can be easily implemented into existing production facilities, is cost effective, and significantly improves the integrity of borderless vias by substantially reducing or eliminating void formation during filling of a borderless via with conductive material.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and PECVD. Normally, when high melting metal point metals such as tungsten are deposited, CVD techniques are employed. Low melting point metals, such as aluminum and aluminum-base alloys, including aluminum-copper alloys, can also be deposited by evaporation, sputtering, or other physical vapor deposition (PVD) method.

In the present descriptions, numerous specific details are set forth, such as specific materials, structures, chemicals, processes, etc., in order to provide a thorough understanding of the present invention. However, the present invention can be practiced without resorting to the details specifically set forth. In other instances, well-known processing structures have not been described in detail in order not to unnecessarily obscure the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device, the method comprising the sequential steps of:
    forming a first patterned conductive layer, having gaps therein and comprising a first conductive feature, on a first dielectric layer overlying a substrate;
    depositing a layer of hydrogen silsequioxane (HSQ) filling the gaps;
    depositing a second dielectric layer on the first patterned conductive layer and on the HSQ gap fill layer;
    planarizing an upper surface of the second dielectric layer;
    forming a through-hole in the second dielectric layer exposing a portion of the upper surface and at least a portion of a side surface of the first conductive feature, and penetrating into and exposing at least a portion of the HSQ gap fill layer;
    depositing a barrier layer on at least a portion of the exposed portions of the HSQ gap fill layer;
    low pressure baking to drive off impurities contained in the HSQ gap fill layer; and
    filling the through-hole with a conductive material deposited on the barrier layer to form a borderless via.

2. The method according to claim 1, wherein the first patterned conductive layer comprises a metal layer and the first conductive feature comprises a first metal feature.

3. The method according to claim 2, wherein the metal layer is a composite metal layer comprising:
    a lower refractory metal layer;
    an intermediate primary conductive layer comprising aluminum or an aluminum alloy; and
    an upper anti-reflective coating.

4. The method according to claim 2, wherein the metal layer comprises a plurality of metal lines having a size no greater than about 0.25 microns, and the gaps comprise interwiring spacings.

5. The method of claim 1, wherein the low pressure baking step comprises baking at a temperature of about 445° C. to 485° C.

6. The method of claim 5, wherein the low pressure baking step and the conductive material filling step are performed at substantially the same temperatures.

7. The method of claim 6, wherein the low pressure baking step further comprises baking at a pressure of about 20 Torr for about 10 seconds to about 20 seconds.

8. The method of claim 5, wherein the low pressure baking step further comprises baking at a pressure of about 20 Torr to about 40 Torr.

9. The method of claim 8, wherein the low pressure baking step further comprises baking for about 10 seconds to about 20 seconds at a pressure of about 20 Torr and a temperature of about 445° C.

10. The method of claim 8, wherein the conductive material filling step is performed at a first temperature and first pressure, and the low pressure baking step is performed at a second temperature greater than or equal to the first temperature, and a second pressure less than the first pressure.

11. The method of claim 1, wherein no intervening wet or thermal processing is performed between the low pressure baking and filling the through-hole with the conductive material stress to form the borderless via.

12. The method of claim 1, wherein the low pressure baking step and the conductive material filling step are performed in the same reaction chamber.

13. The method of claim 12, wherein the filling step comprises:
    concurrently initiating a silane reduction-based tungsten chemical vapor deposition and a hydrogen reduction-based tungsten chemical vapor deposition; and
    halting the silane reduction-based tungsten chemical vapor deposition a predetermined time after the initiation thereof, while continuing the hydrogen reduction-based tungsten chemical vapor deposition.

14. The method of claim 1, further comprising a step of vacuum baking following the step of forming the through-hole and before the step of depositing the barrier layer.

15. The method of claim 14, wherein the vacuum baking step comprises vacuum baking at a first temperature, and the low-pressure baking step comprises baking at a second temperature higher than the first temperature.

16. The method of claim 15, wherein the step of low pressure baking is performed in the same tool employed for the step of filling the through-hole with the conductive material.

17. A method of manufacturing a semiconductor device, the method comprising the sequential steps of:
    forming a first patterned conductive layer, having gaps therein and comprising a first conductive feature, on a first dielectric layer overlying a substrate;
    depositing a layer of hydrogen silsesquioxane (HSQ) filling the gaps;

depositing a second dielectric layer on the first patterned conductive layer and on the HSQ gap fill layer;

planarizing an upper surface of the second dielectric layer;

forming a through-hole in the second dielectric layer exposing at least a portion of the upper surface of the first conductive feature, and exposing at least a portion of the HSQ gap fill layer;

vacuum baking to outgas impurities contained in the HSO gap fill layer;

low pressure baking to drive off impurities contained in the HSQ gap fill layer; and filling the through-hole with a conductive material deposited on the barrier layer.

18. The method of claim 17, wherein the through-hole forming step includes exposing at least a portion of a side surface of the first conductive feature, the filling step comprising forming a borderless via.

19. The method of claim 17, wherein the step of depositing a barrier layer step comprises depositing titanium nitride on at least the exposed portions of the HSQ gap fill layer.

20. The method of clam 17, wherein the low pressure baking step comprises:

baking at a pressure of about 20 Torr to about 40 Torr for about 10 seconds to about 20 seconds at a temperature of about 445° C. to about 485° C.

21. The method of claim 20, wherein the vacuum baking step comprises baking at a temperature of less than 445° C.

22. The method of claim 17, wherein the first patterned conductive layer comprises a metal layer and the first conductive feature comprises a first metal feature.

23. The method of claim 22, wherein the metal layer is a composite metal layer comprising:

a lower refractory metal layer;

an intermediate primary conductive layer comprising aluminum or an aluminum alloy; and an upper anti-reflective coating.

24. The method of claim 23, wherein the metal layer comprises a plurality of metal lines having a size no greater than about 0.25 microns, and the gaps comprise interwiring spacings.

25. The method of claim 17, wherein the low pressure baking step comprises baking at a temperature of about 445° C. to 485° C.

26. The method of claim 25, wherein the low pressure baking step and the conductive material filling step are performed at substantially the same temperatures.

27. The method of claim 26, wherein the low pressure baking step further comprises baking at a pressure of about 20 Torr for about 10 seconds to about 20 seconds.

28. The method of claim 25, wherein the low pressure baking step further comprises baking at a pressure of about 20 Torr to about 40 Torr.

29. The method of claim 28, wherein the low pressure baking step further comprises baking for about 10 seconds to about 20 seconds at a pressure of about 20 Torr and a temperature of about 445° C.

30. The method of claim 17, wherein no intervening wet or thermal processing is performed between the low pressure baking and filling the through-hole with the conductive material stress to form the borderless via.

31. The method of claim 17, wherein the low pressure baking step and the conductive material filling step are performed in the same reaction chamber.

32. The method of claim 17, wherein the vacuum baking step comprises vacuum baking at a first temperature, and the low-pressure baking step comprises baking at a second temperature higher than the first temperature.

33. The method of claim 32, wherein the step of low pressure baking is performed in the same tool employed for the step of filling the through-hole with the conductive material.

* * * * *